United States Patent
Schott et al.

(10) Patent No.: US 10,620,277 B2
(45) Date of Patent: Apr. 14, 2020

(54) MAGNETIC FIELD SENSOR AND METHOD FOR MAKING SAME

(71) Applicants: MELEXIS TECHNOLOGIES NV, Tessenderlo (BE); X-CELEPRINT LIMITED, Dublin (IE)

(72) Inventors: Christian Schott, Lussy-sur-Morges (CH); Matthew Meitl, Durham, NC (US); Christopher Bower, Raleigh, NC (US)

(73) Assignees: MELEXIS TECHNOLOGIES NV, Tessenderlo (BE); X-CELEPRINT LIMITED, Dublin (IE)

( * ) Notice: Subject to any disclaimer, the term of this patent is extended or adjusted under 35 U.S.C. 154(b) by 246 days.

(21) Appl. No.: 15/524,003

(22) PCT Filed: Nov. 3, 2015

(86) PCT No.: PCT/EP2015/075646
§ 371 (c)(1),
(2) Date: May 3, 2017

(87) PCT Pub. No.: WO2016/071370
PCT Pub. Date: May 12, 2016

(65) Prior Publication Data
US 2017/0328962 A1    Nov. 16, 2017

(30) Foreign Application Priority Data
Nov. 3, 2014  (GB) .................................. 1419515.0

(51) Int. Cl.
*G01R 33/07*    (2006.01)
*H01L 43/04*    (2006.01)
(Continued)

(52) U.S. Cl.
CPC ......... *G01R 33/07* (2013.01); *G01R 33/0052* (2013.01); *G01R 33/077* (2013.01);
(Continued)

(58) Field of Classification Search
CPC .. B64G 1/366; G01R 33/0206; G01R 33/028; G01R 33/038; G01R 33/1215
(Continued)

(56) References Cited

U.S. PATENT DOCUMENTS 4,398,342 A * 8/1983 Pitt .......................... H01L 43/14
257/425
4,908,685 A * 3/1990 Shibasaki .......... G01R 33/0052
257/425
(Continued)

FOREIGN PATENT DOCUMENTS

GB    2081973 A    2/1982
JP    S584991 A    1/1983
(Continued)

OTHER PUBLICATIONS

Chinese Office Action from CN Application No. 201580059296.7, dated Dec. 3, 2018.
(Continued)

*Primary Examiner* — Tung X Nguyen
*Assistant Examiner* — Robert P Alejnikov, Jr.
(74) *Attorney, Agent, or Firm* — Workman Nydegger

(57) ABSTRACT

A semiconductor chip for measuring a magnetic field. The semiconductor chip comprises a magnetic sensing element, and an electronic circuit. The magnetic sensing element is mounted on the electronic circuit. The magnetic sensing element is electrically connected with the electronic circuit. The electronic circuit is produced in a first technology and/or first material and the magnetic sensing element is
(Continued)

produced in a second technology and/or second material different from the first technology/material.

8 Claims, 3 Drawing Sheets

(51) Int. Cl.
  H01L 23/00 (2006.01)
  G01R 33/00 (2006.01)
(52) U.S. Cl.
  CPC .............. *H01L 24/24* (2013.01); *H01L 24/82* (2013.01); *H01L 24/94* (2013.01); *H01L 43/04* (2013.01); *H01L 2224/24146* (2013.01); *H01L 2224/2919* (2013.01); *H01L 2224/32145* (2013.01); *H01L 2224/32245* (2013.01); *H01L 2224/48091* (2013.01); *H01L 2224/48247* (2013.01); *H01L 2224/73227* (2013.01); *H01L 2224/73265* (2013.01); *H01L 2224/73267* (2013.01); *H01L 2224/83005* (2013.01); *H01L 2224/92137* (2013.01); *H01L 2224/92244* (2013.01); *H01L 2224/94* (2013.01); *H01L 2224/97* (2013.01); *H01L 2924/10253* (2013.01); *H01L 2924/10329* (2013.01); *H01L 2924/181* (2013.01)
(58) Field of Classification Search
  USPC .................................................. 324/251, 252
  See application file for complete search history.

(56) References Cited

U.S. PATENT DOCUMENTS

| | | | |
|---|---|---|---|
| 2001/0022373 A1 | 9/2001 | Minakata et al. | |
| 2002/0021124 A1* | 2/2002 | Schott | G01D 5/145 324/207.2 |
| 2007/0099031 A1 | 5/2007 | Chung et al. | |
| 2009/0137066 A1* | 5/2009 | Imai | H01L 27/222 438/3 |
| 2011/0187360 A1* | 8/2011 | Maile | A61N 1/3718 324/251 |
| 2011/0187361 A1 | 8/2011 | Vanhelmont et al. | |
| 2012/0007589 A1 | 1/2012 | Okada | |
| 2012/0314388 A1* | 12/2012 | Bower | H01L 21/563 361/760 |
| 2014/0091474 A1* | 4/2014 | Starkston | H01L 23/5385 257/774 |
| 2014/0167749 A1* | 6/2014 | Kim | G01V 3/40 324/251 |
| 2016/0003760 A1* | 1/2016 | Etzkorn | A61B 5/14507 205/122 |
| 2018/0138352 A1* | 5/2018 | Aiken | H01L 31/184 |

FOREIGN PATENT DOCUMENTS

| | | | | |
|---|---|---|---|---|
| JP | 2002036017 A | * | 2/2002 | ............. H01L 27/00 |
| JP | 2003243646 A | | 8/2003 | |
| JP | 2011238881 | | 11/2011 | |
| JP | 2014086677 A | | 5/2014 | |
| WO | 2012018997 A2 | | 2/2012 | |
| WO | 2013109593 A2 | | 7/2013 | |

OTHER PUBLICATIONS

Great Britain Search Report for corresponding Great Britain Application No. 1419515.0, dated Apr. 18, 2015.
International Search Report for corresponding International PCT Application No. PCT/EP2015/075646, dated Feb. 5, 2016.
JP Office Action from JP Application No. 2017-522198, dated Jul. 9, 2019.
EP Office Communication from EP Application No. EP15790538.1, dated Jul. 10, 2019.

* cited by examiner

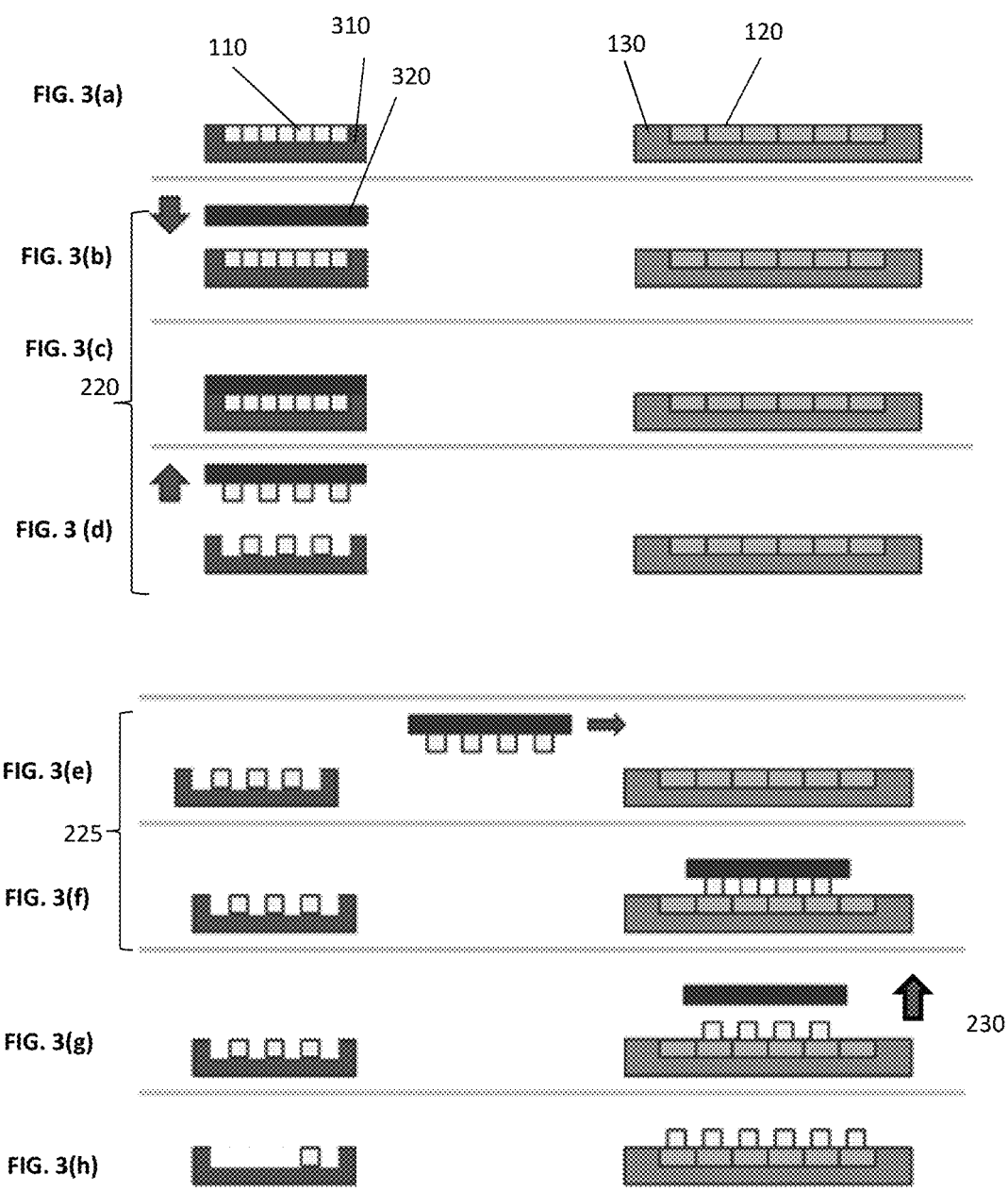

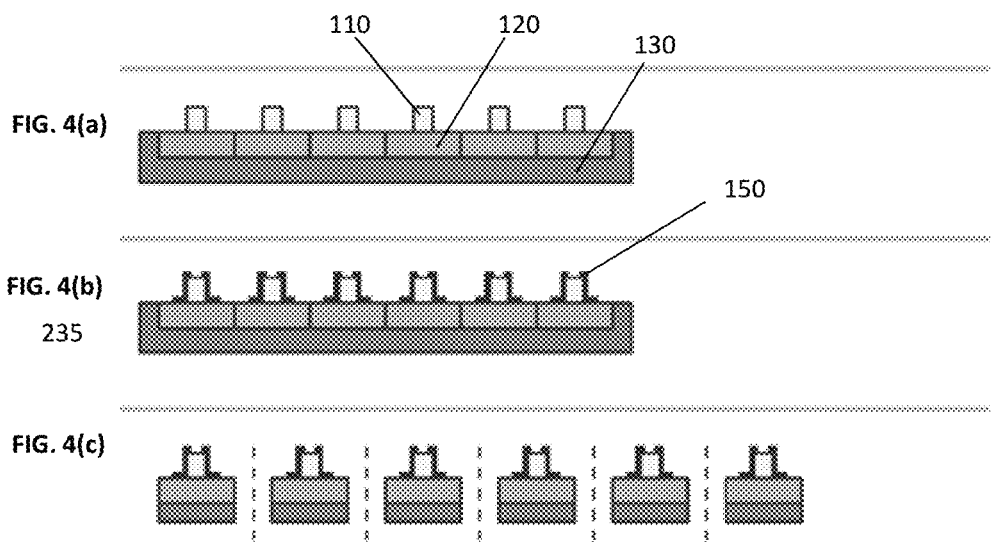
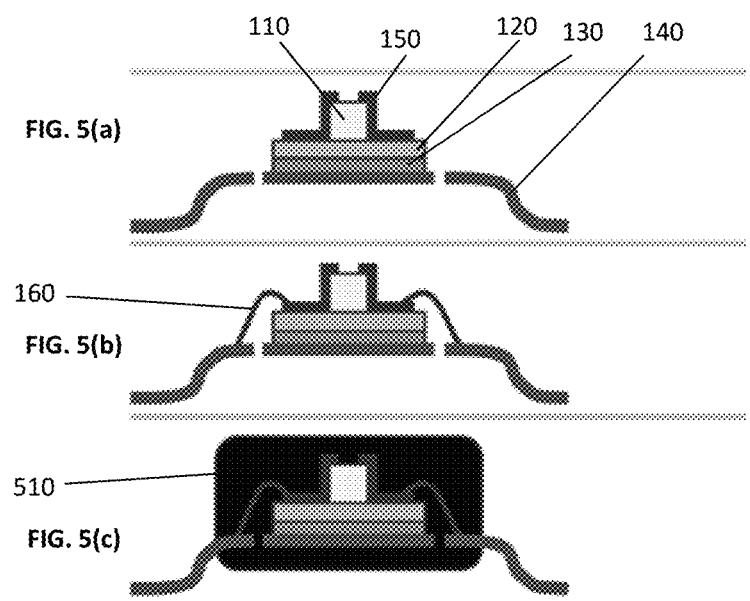

MAGNETIC FIELD SENSOR AND METHOD FOR MAKING SAME

FIELD OF THE INVENTION

The invention relates to the field of semiconductor chips for measuring a magnetic field. More specifically it relates to a magnetic field sensor with an increased sensitivity and/or speed and a method for creating such a sensor.

BACKGROUND OF THE INVENTION

Magnetic field sensors are known in the art. Today's microelectronic magnetic sensors are typically made in silicon technology, since this allows for cost-effective, miniaturized and complex integration of advanced analog and digital circuitry.

However, Hall devices as magnetic sensor do not show high sensitivity if made in silicon. This is caused by the relatively low mobility of electrons, reaching as maximum about 1500 cm$^2$/Vs at room temperature.

In order to satisfy the requirements of sensing tasks which are either working with very low field (e.g. a compass sensor) or very high speed (e.g. an electrical current sensor capable of sensing a high frequency field), the sensor device itself needs to be made in a different technology with different material, e.g. GaAs, InSb, magnetoresistive, quantum well or other.

Existing solutions using such materials are either discrete combinations of the sensing device and the integrated electronics which are assembled side-by-side on a carrier plate, e.g. the leadframe of a plastic package and which are then interconnected by wire bonding or they are implemented as multilayer structures grown on top of a substrate. While addressing the issue of sensitivity and/or speed, these structures are subject to mechanical stress due to the different coefficients of thermal expansion leading to reliability problems and to degraded sensor performance. Furthermore, such devices are typically much more expensive than magnetic sensors made from silicon.

SUMMARY OF THE INVENTION

It is an object of embodiments of the present invention to provide magnetic sensors which have a good sensitivity and/or a good speed, for example a sensitivity and/or speed higher than obtainable by magnetic sensors made of silicon, and a method of making same.

It is an object of particular embodiments of the present invention to provide a method of producing a compound magnetic sensor with good performance (e.g. in terms of sensitivity and/or speed) in a reliable way, preferably in a low-cost and reliable way suitable for high volume production, and a compound magnetic sensor so produced.

It is an object of specific embodiments of the present invention to provide a method of producing a compound magnetic sensor with good performance (e.g. in terms of sensitivity and/or speed), whereby a sensing device is mounted on a CMOS circuit in a reliable manner, preferably a low cost and reliable manner suitable for mass production, and a compound magnetic sensor so produced.

The above objective is accomplished by a method and device according to embodiments of the present invention.

In a first aspect, the present invention provides a hybrid semiconductor chip for measuring a magnetic field, the semiconductor chip comprising a magnetic sensing element and an electronic circuit. The magnetic sensing element is mounted on and electrically connected with the electronic circuit. The electronic circuit is produced in a first technology and comprises a first material and the magnetic sensing element is produced in a second technology different from the first technology and comprises a second material different from the first material. An adhesive layer is present between the magnetic sensing element and the electronic circuit.

It is an advantage of embodiments of the present invention that a first technology and/or material can be used for implementing the electronic circuit, and another technology/material can be used for implementing the magnetic sensing element.

This allows the electronic circuit to be produced in a first technology that may be more cost effective and/or more reliable and/or more suitable for mass production. At the same time this allows to produce the sensing element in a second technology which is better suited for the sensing element. In this way, the advantages of both worlds can be combined.

Moreover, if only the sensing element is produced in the second material, the density of sensing elements on the second material can be higher than if also the electronic circuit (comprising bond pads) would have been produced in the second material.

The semiconductor chip may be an integrated magnetic sensor, e.g. a sensor that is ideally suited for measuring weak magnetic fields (such as e.g. in a compass), or for measuring currents, or for measuring a position, for example for measuring an angular motor position.

The electronic circuit may comprise readout circuitry for reading a value from the magnetic element, but may also include other circuitry, such as e.g. processing circuitry for processing said signal (e.g. amplifying, digitizing, correcting offset, etc.) and/or readout-circuitry for providing a value representative of the magnetic field to an output and/or memory, e.g. for storing calibration data such as for example offset values, or temperature correction values, etc.

In a semiconductor chip according to embodiments of the present invention, the second material may be chosen such that the carrier mobility at room temperature is higher in the second material than in the first material.

It is an advantage of embodiments of the present invention that the carrier mobility in the magnetic sensing element is higher when it is implemented in the second material through the second technology as compared to the case when it would be implemented in the first material through the first technology. Because of the higher mobility, a magnetic sensor implemented using the second technology has a higher sensitivity and/or a higher speed than would be the case when the first technology is used for implementing the magnetic sensor. It is therefore an advantage of embodiments of the present invention that the carrier mobility in the second material is higher than the carrier mobility in the first material.

In a semiconductor chip according to embodiments of the present invention, the magnetic sensing element may comprise at least one Hall sensor.

It is an advantage of embodiments of the present invention that the magnetic sensor comprises or is a Hall sensor made of a second material having a higher carrier mobility than the first material of the electronic circuit. The at least one Hall sensor may be implemented as a horizontal Hall element, but a vertical Hall element may also be used. Using a plurality of Hall sensors may be advantageous for decreasing offset noise, or for reducing position offset errors, etc.

Using a Hall sensor rather than other magnetic sensing elements such as e.g. magnetoresistive elements, offers an advantage because Hall elements are very small, typically a few ten microns of size. Compared to anisotropic magnetoresistive (AMR) technology they also provide the sign of the applied flux density. Compared to giant magnetoresistive (GMR) technology or tunnel magnetoresistive (TMR) technology they do not need a pinned magnetic layer which can degrade over temperature lifetime or in strong parasitic magnetic fields.

Additionally Hall elements have better linearity and a bigger magnetic range without saturation and the need for strap set/reset pulses to de-re-magnetize the magnetoresistive material.

In a semiconductor chip according to embodiments of the present invention, the magnetic sensing element may have a thickness of less than 5 μm.

In embodiments of the present invention, the Hall element can be made thinner by manufacturing the sensing element using a sacrificial layer singulation technology. The thickness of the magnetic element may be smaller than 5 μm, or even smaller than 3 μm, or even smaller than 1 μm.

In embodiments of the present invention, the magnetic sensing element may be a quantum well Hall sensor. Quantum well Hall sensors as magnetic sensing element, utilize the heterojunction between two semiconducting materials to confine electrons to a quantum well. These electrons exhibit higher mobilities than those in bulk devices by mitigating the deleterious effect of ionized impurity scattering. Therefore a higher sensitivity can be obtained. Two closely spaced heterojunction interfaces may be used to confine electrons to a rectangular quantum well. The carrier densities within the two-dimensional electron gas (2DEG) can be controlled by choosing the materials and alloy compositions.

In a semiconductor chip according to embodiments of the present invention, the second material may comprise gallium-arsenide.

It is an advantage of embodiments of the present invention that the maximum mobility of the electrons in GaAs (gallium-arsenide) is about 8500 $cm^2/Vs$ at room temperature, while the maximum mobility of the electrons in for example silicon is only about 1500 $cm^2/Vs$ at room temperature. By using Ga—As as second material, the sensitivity or the speed of the semiconductor chip can be increased as compared to a magnetic sensor made of silicon.

In a semiconductor chip according to embodiments of the present invention, the first material may be made of silicon.

It is an advantage of embodiments of the present invention that low-cost CMOS technology can be used for the electronic circuit and that this can be combined with another technology, having a higher mobility of the electrons, for the magnetic sensing element. This allows to combine the advantages of both worlds, namely: for cost-effective, miniaturized and complex integration of advanced analog and digital circuitry.

A semiconductor chip according to embodiments of the present invention may comprise a conductive layer for making the electrical connection between the electronic circuit and the magnetic sensing element. The conductive layer may be a structured distribution layer, whereby the distribution layer is for example structured by selective etching. The distribution layer is thereby structured such that it can connect the source element(s) electrically to the target CMOS IC. This may result in wires which are typically between 1 and 10 μm wide, but can also be smaller or wider.

Preferably the thickness of the distribution layer is less than 5.0 μm, more preferably between 1.0 μm and 2.0 μm. This offers the advantage that it can be manufactured without creating reliability issues for instance due to cracks in bends and due to lift-off generated by mechanical forces caused by the difference between the thermal expansion coefficients of the metal distribution layer and of the underlying materials (e.g. silicon, $SiO_2$, SiN, GaAs)

A semiconductor chip according to embodiments of the present invention may further comprise a ferromagnetic layer on top of the distribution layer. It is an advantage of adding a ferromagnetic layer on top of the distribution layer, that such material attracts magnetic field lines. In this way, the strength of the magnetic field sensed by the magnetic sensing element can be increased in a passive way (i.e. without additional power). Next to a sensitivity boost, the layer can also convert flux lines from horizontal to vertical so they can be sensed by conventional horizontal Hall elements. The ferromagnetic layer is also referred to as magnetic concentrator. Preferably the magnetic concentrator is an integrated magnetic concentrator (also known as "IMC"), having any suitable shape and size and thickness. More information about IMC can be read e.g. in US20020021124.

The ferromagnetic layer can be realized as glued-on ribbons or as sputtered material which is then structured to obtain the final shape. Ferromagnetic layers can be grown on a base layer. Ferromagnetic layers may be similar to the RDL layer and can therefore be one and the same layer, re-used for interconnect and IMC process at the same time (as well as for bumping)

In a second aspect, the present invention provides a method of manufacturing a semiconductor chip for measuring a magnetic field. The method comprises manufacturing at least one target device comprising an electronic circuit using a first technology and a first material on a first wafer;

manufacturing at least one source device comprising a magnetic sensing element using a second technology and a second material on a second wafer, the second technology being different from the first technology, and the second material being different from the first material, whereby the second material is chosen such that the carrier mobility is higher in the second material than in the first material at room temperature;

transferring the at least one target device to the at least one source device, by executing the following steps at least once:
  covering at least one landing area of the target device with an adhesive layer, on which landing area the source device is to be mounted;
  lifting-off the at least one source device from the second wafer by a conformable transfer element;
  positioning the at least one source device onto the at least one landing area of the target device;
  lifting-off the transfer stamp from the positioned at least one source device; and
connecting the at least one source device electrically to the target device.

The method may furthermore comprise packaging the at least one source device and the at least one target device so as to form a packaged semiconductor chip.

It is an advantage of embodiments of the present invention that a target device, implemented in a first technology (e.g. CMOS technology), can be combined with a source device, implemented in a second technology (e.g. GaAs, InSb), by mounting rather than by epitaxial growth. In this way the benefits of two different technologies can be used, without the disadvantages of thermal stress, resulting in a more reliable product.

It is an advantage of embodiments of the present invention that the source device can be mounted on the target device, and that they can be electrically interconnected.

In a method according to embodiments of the present invention, the source device (with magnetic sensing element) is mounted on the target device (with electronic circuit), by a technique called "transfer printing", rather than by wafer bonding.

A major advantage of using transfer printing over wafer bonding is that the first and the second wafer can be of different size, whereas for wafer bonding, it is preferable that the first and second wafers are of the same size. In an exemplary embodiment of the present invention the second wafer is made of GaAs. These wafers have a typical size of 6 inch. The first wafer may be made of silicon. In CMOS technology the size of the wafer is typically 8 or 12 inch. By using only the area of each wafer that is actually needed, rather than e.g. using only 6 inch of the silicon wafer in order to match the size of the Ga—As wafer, the surface of both wafers can be optimally used. Furthermore, not only the wafers, but also the source and target device can have different dimensions, further increasing the efficient use of the surface area of both wafers.

It is a further advantage of the method according to embodiments of the present invention that the electrical interconnection between the source and target parts can be made by a dedicated optimized post-process to assure reliable low-ohmic connection. Typical interconnection resistances are in 1-10 Ohms range. This is about 2-3 orders of magnitude lower than the resistance of a Hall sensor.

It is a further advantage of embodiments of this method that it allows the source devices and target devices to be made independently by different technologies and processing time, allowing not only a different process to be used, but also allowing that the parts of the source wafer to be much smaller and denser in spacing than the target wafer parts, thus allowing the space of both wafers to be optimally used.

It is an advantage of embodiments of the present invention that this mounting and electrical interconnection can be done at low-cost, reliably and in high volume. It is thereby an advantage that transfer printing is moving many thousands of source devices onto the landings of the target wafer in one transfer step. Moreover, the interconnection step can done by a wafer batch process, so that the 1000 to 100'000 devices on the target wafer are all interconnected by one single post-process which is well established in semiconductor industry and therefore reliably mastered.

Embodiments of the present invention that are using transfer printing to move source device to target devices have the advantage that the growth substrate of the hall sensor material can be re-used because during the transfer printing the wafer is not diced and can be re-used. This leads to significant cost savings on a InSb or InGaAs or InAs hall sensor. It is an advantage of using transfer printing that it is possible to micro-assemble elements which are too small to assemble using standard techniques.

It is an advantage of using transfer printing that it is possible to micro-assemble elements which are too thin to assemble using standard assembly techniques.

It is an advantage of using transfer printing that it is possible to densely fabricate elements on a source wafer as it is not required to foresee large streets for dicing.

It is an advantage of embodiments of the present invention that the built-in stress between the first and second materials is diminished or eliminated as compared to the case when epitaxially growing a target device on a source device. Epitaxial growth of different materials on top of each other may lead to mechanical stress due to the different coefficients of thermal expansion. This mechanical stress may be the cause of reliability problems and degraded system performance.

It is an advantage of embodiments of the present invention that source devices on the second wafer are smaller and can be positioned closer to each other (denser) than the target devices on the first wafer. It is therefore an advantage of embodiments of the present invention that the second wafer can be maximally used to produce source devices.

The source device may comprise or may be any magnetic sensing element such as a Hall sensor, a magnetoresistive sensor, quantum well Hall sensor.

It is an advantage of embodiments of the present invention that the source devices can relatively easily be mounted on the target devices even if the first and second wafer are of a different size.

It is an advantage of embodiments of the present invention that the electrical connections between the source device and the target device can be low ohmic. The sensitivity of the semiconductor chip for the magnetic field can be increased by providing low ohmic interconnects between the source device and the target device.

The adhesive layer may be a photo-sensitive layer. It is an advantage of using such a layer that its adhesive strength may be selectively altered, by selectively exposing the adhesive layer to an electromagnetic radiation. Use of such a process step is e.g. described in US2012/0314388, which is incorporated herein by reference in its entirety. But other adhesives whose strength can be selectively modified may also be used. The step of printing transferable components using a transfer stamp is for example described in WO2013/109593, which is incorporated herein by reference in its entirety. The last step of packaging is a conventional step, and typically comprises dicing the wafer to separate individual dies, attaching each die to a lead frame, bonding the legs of the leadframe to connection points on the die, injection molding with a plastic package.

In a method according to embodiments of the present invention, the step of connecting the at least one source device electrically to the target device may comprise applying a conductive distribution layer. A conductive distribution layer can provide a low-ohmic electrical interconnection, and can be applied in a reliable manner. It is an advantage of using a distribution layer (also known as RDL), that big costly pads for bumps or wirebonds can be avoided.

A method according to embodiments of the present invention may further comprise the step of applying a ferromagnetic layer on top of the conductive distribution layer. The ferromagnetic layer is also referred to as an integrated magnetic concentrator. It is an advantage of embodiments of the present invention that the sensitivity of the semiconductor chip for the magnetic field can be increased by the presence of an integrated magnetic concentrator.

In embodiments of the present invention the magnetic concentrator is put on top of the entire assembly, once the transfer printing and the formation of the redistribution metal layer for contacting is done.

A method according to embodiments of the present invention may further comprise an additional bumping process wherein the conductive distribution layer serves as a redistribution layer for the bumping process.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

BRIEF DESCRIPTION OF THE DRAWINGS

FIG. 3(a) to (h) illustrate a first series of steps, including the corresponding intermediate products, as part of a method for manufacturing a semiconductor chip according to an embodiment of the present invention.

FIG. 4(a) to (c) illustrate a second series of steps, including the corresponding intermediate products, as part of a method for manufacturing a semiconductor chip according to an embodiment of the present invention.

FIG. 5(a) to (c) illustrate a third series of steps, including the corresponding intermediate products, as part of method for manufacturing a semiconductor chip according to an embodiment of the present invention.

Figure 1:
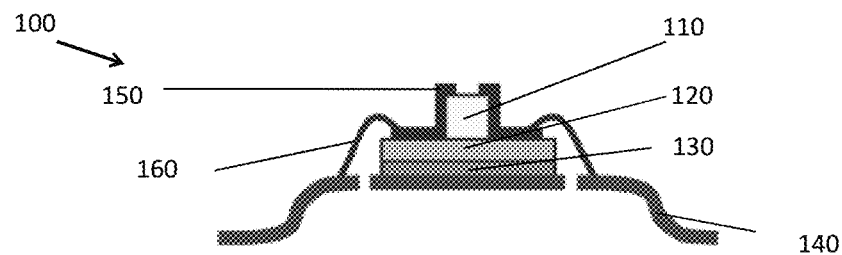
FIG. 1 provides a schematic vertical cross-section of a semiconductor chip comprising a magnetic sensing element produced in a first technology and an electronic circuit produced in a second technology, in accordance with an embodiment of the present invention.

The drawings are only schematic and are non-limiting. In the drawings, the size of some of the elements may be exaggerated and not drawn on scale for illustrative purposes.

Any reference signs in the claims shall not be construed as limiting the scope.

In the different drawings, the same reference signs refer to the same or analogous elements.

DETAILED DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

Where in embodiments of the present invention reference is made to "a technology" or "a semiconductor technology", reference is made to for example silicon CMOS technology, or to a compound semiconductor technology such as a III-V semiconductor technology (e.g. gallium-arsenide, indium-antimonide, indium-phosphide, gallium-nitride) amongst others. Materials used may be materials with high electron mobilities such as graphene and other two-dimensional materials with high electron mobilities. Technologies used may be magnetoresistive technologies.

Where in embodiments of the present invention reference is made to a first technology, reference is made to a technology which typically processes a first material. Where in embodiments of the present invention reference is made to a second technology, reference is made to a technology which typically processes a second material. The first material is thereby different from the second material in the sense that epitaxial growth from one material on the other material would result in structural mismatch and/or thermal stress between both.

In a first aspect, the present invention relates to a semiconductor chip 100 for measuring a magnetic field. The semiconductor chip comprises a magnetic sensing element 110 e.g. for measuring the strength of magnetic field components directed perpendicular or parallel to its upper surface, and an electronic circuit 120 for reading out the measured strength, and optionally for further processing the readout-value. Further processing might include amplification and/or filtering of the signal. It might also include offset reduction, linearization and algebraic combination of several signal channels. Further processing might in general include any signal processing that analog or digital electronics can provide. According to embodiments of the present invention the magnetic sensing element 110 is mounted on the electronic circuit 120 and the magnetic sensing element 110 is electrically connected with the electronic circuit 120. In embodiments of the present invention the electronic circuit 120 is produced in a first technology using a first material (e.g. CMOS technology using silicon substrates).

In embodiments of the present invention the magnetic sensing element 110 is produced in a second technology using a second material. The second technology/second material may be a compound semiconductor technology such as a III-V semiconductor technology (e.g. GaAs, InSb, InGaAs, InGaAsSb, InAs). The magnetic sensing element 110 may for example be a magnetoresistive element, a Hall sensor, or a quantum well Hall sensor. It is thereby an advantage of embodiments of the present invention that the electron mobility in the magnetic sensor 110 is higher than if it would be implemented using the first technology/material.

In an exemplary embodiment of the present invention, the semiconductor chip 100, for measuring a magnetic field, may be used as a compass sensor. It is thereby an advantage that for the magnetic sensing element 110 a technology with a higher carrier mobility is used than the technology which is used for making the electronic circuit 120. The consequence thereof is that a semiconductor chip with a higher sensitivity for a magnetic field can be made which is for example advantageous when it is used as a compass sensor. For example, the carrier mobility in GaAs is 5 times higher (8000 cm$^2$/Vs) compared to Si (1400 cm$^2$/Vs). Therefore the sensitivity of a GaAs Hall device is about 5 times higher than the one of a silicon Hall device.

In another exemplary embodiment of the present invention the semiconductor chip 100, for measuring a magnetic field, is used as an electrical current sensor. Thereby the magnetic field around a conductor, generated by an electrical current running through said conductor, is measured. It is an advantage of embodiments of the present invention that the magnetic sensing element 110 is made in a different technology/from a different material than the electronic circuit 120. Thereby the technology/material (e.g. Ga—As) of the magnetic sensing element 110 is chosen such that it has a higher carrier mobility compared to the carrier mobility in the technology/material (e.g. silicium) used for the electronic circuitry 120. This allows to measure currents at a higher frequency than would be the case if the magnetic sensor were implemented in the first technology/first material (e.g. silicium). The first technology can for example be silicon CMOS technology, because this is a highly reliable and cost effective technology.

In embodiments of the present invention the magnetic sensing element 110 is a Hall sensor. In embodiments of the present invention the magnetic sensing element 110 is a quantum well Hall sensor. The quantum Hall sensor might for example be produced in a III-V technology and comprise an gallium-arsenide layer sandwiched between two layers of aluminium-gallium-arsenide. The quantum Hall sensor might alternatively include an indium-gallium arsenide layer sandwiched between two layers of aluminum-gallium arsenide.

In embodiments of the present invention the second material has at least one desired property which cannot be achieved with the first material. In embodiments of the present invention the second material has a higher electron mobility than the first material (e.g. the first material being silicon and the second material being a high electron mobility material such as GaAs, InSb, InAs, InGaAs, InGaAsSb, InP)

In embodiments of the present invention the first material might for example be silicon. Using silicon has the advantage that standard CMOS technology can be used and using gallium-arsenide has the advantage of a higher carrier mobility compared to silicon. In this way the advantages of both technologies can be combined.

In embodiments of the present invention the semiconductor chip 100 comprises a conductive distribution layer 150. This distribution layer 150 makes the electrical connection between the electronic circuit 120 and the magnetic sensing element 110. In embodiments of the present invention the distribution layer has a maximum thickness of 5 μm. The distribution layer may be made of any common metal know in the art of semiconductor wiring such as: Al, AlCu, AlCuSi, W, Cu, Au, Ag, Ti, Mo, amongst others.

In embodiments of the present invention the semiconductor chip 100 further optionally comprises a ferromagnetic layer, also referred to as the integrated magnetic concentrator, on top of the distribution layer 150. Such a layer attracts magnetic field lines, and can be used for increasing the field strength measured by the sensor, hence, to even further increase the sensitivity. The thickness of the ferromagnetic layer may vary between 1 and 50 μm, preferably between 10 and 20 μm. The size and shape of the ferromagnetic layer may be adapted to the product requirements. For low field use the thickness of the layer is typically large (>200 μm) to exhibit strong magnetic gain. As the sensing element is typically small (<100 μm), the ferromagnetic layer is processed at the end on top of the hybrid sensor. The integrated magnetic concentrator (IMC) may not be directly on top of the magnetic sensing element (e.g. the GaAs Hall plate), since the IMC can be much bigger than the magnetic sensing element itself. In an exemplary embodiment of the present invention a constellation of four magnetic sensing elements (e.g. Hall elements with a size of 30 μm) may be distributed under the edge of an IMC disk of 400 μm size to form the two orthogonal axes for a magnetic angle sensor.

In embodiments of the present invention the semiconductor chip further optionally comprises a magnetic concentrator, also known as IMC (integrated magnetic concentrator). By adding a magnetic concentrator, the density of magnetic field lines at the magnetic sensing element can be increased. This results in an amplification of the magnetic flux density. The IMC may be formed using an electroplating processes, or using micro assembly techniques. The IMC might for example be placed on the semiconductor chip by transfer printing using an elastomer stamp. In an exemplary embodiment of the present invention the IMC is Vitrovac®.

FIG. 1 gives a schematic illustration of a vertical cross-section of a semiconductor chip in accordance with embodiments of the present invention. The figure shows schematically a magnetic sensing element 110 (preferably made of GaAs) and an electronic circuit 120 (preferably made of silicon). In order to simplify the figure the magnetic sensing element 110 and the electronic circuit 120 are only partly shown. Only these parts are shown which are required to demonstrate that the magnetic sensing element 110 is mounted on the electronic circuit 120 and that the magnetic sensing element 110 is electrically connected with the electronic circuit 120. The electrical connection 150 between the magnetic sensing element 110 and the electronic circuit 120 is shown in FIG. 1. The electronic circuit is produced in a first technology and/or first material, and the magnetic sensing element is produced in a second technology and/or second material different from the first technology/material. FIG. 1 also shows a distribution layer 150 in contact with the magnetic sensing element 110 and with the electronic circuit 120. This distribution layer provides an electrical contact between the electronic circuit 120 and the magnetic sensing element 110.

In embodiments of the present invention (not shown) a ferromagnetic layer may optionally be present on top of the distribution layer 150.

In a second aspect, the present invention provides a method 200 for manufacturing a semiconductor chip 100 for measuring a magnetic field whereby a high mobility magnetic sensor 110 is combined with an electronic circuit 120 produced using different technologies and materials resulting in a semiconductor chip 100. The resulting semiconductor chip 100 is therefore a compound (or hybrid) magnetic sensor 100.

In embodiments of the present invention the high mobility magnetic sensing elements 110 (also referred to as or part of "source devices" implemented on a second wafer 310) are positioned on electronic circuits 120 (also referred to as or part of "target devices" on a first wafer 130) using a technique called "transfer printing" such as for example described in WO2012018997A2.

The electronic circuit 120 may be implemented on a silicon chip on a CMOS wafer. In embodiments of the present invention a compound semiconductor chip 100 comprising a magnetic sensing element 110 and an electronic circuit 120 is realized by transfer printing.

Figure 2:
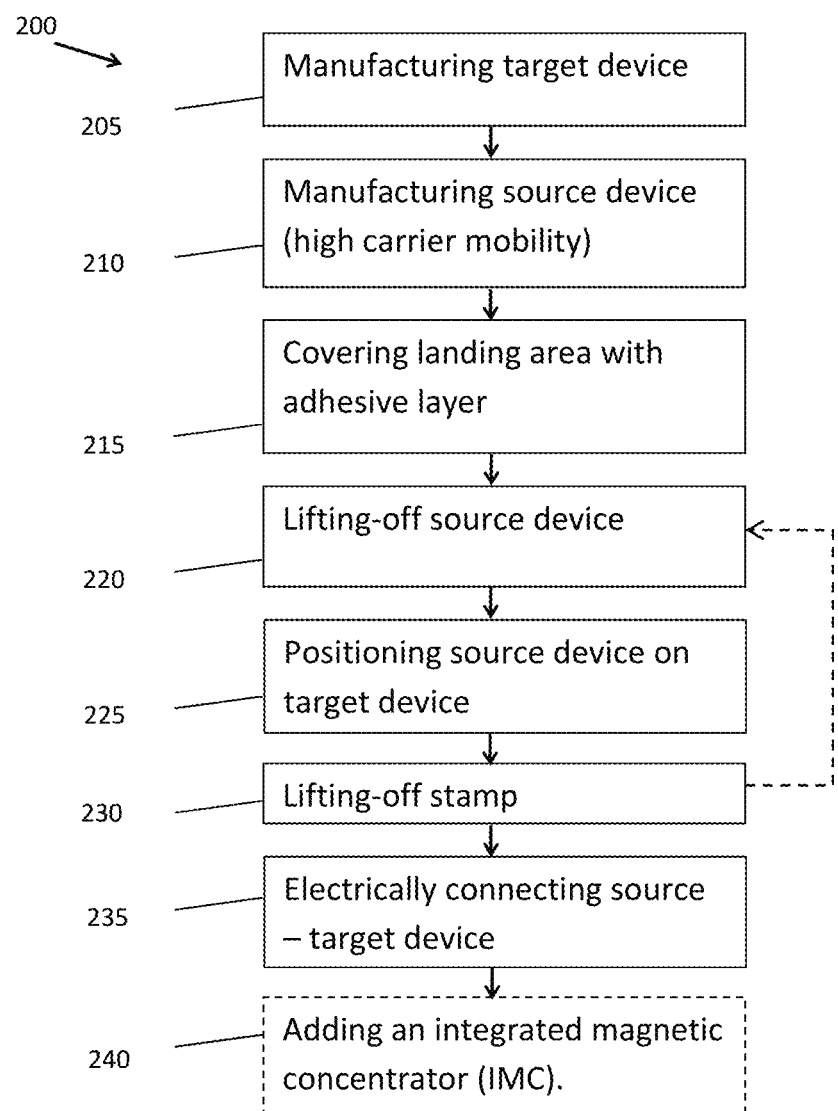
FIG. 2 illustrates a method as can be used for manufacturing the semiconductor chip of FIG. 1, according to an embodiment of the present invention.

FIG. 2 shows a flow chart illustrating the steps of a method 200 for manufacturing a semiconductor chip for measuring a magnetic field comprising the following steps:

a step 205 for manufacturing at least one target device (comprising the electronic circuit 120 magnetic element 110) using a first technology/first material on a first wafer 130, a step 210 for manufacturing at least one source device (comprising a magnetic sensing element 110) using a second technology/second material on a second wafer 310, wherein the carrier mobility of the second material is higher than the carrier mobility of the first material (measured at room temperature), a step 215 for covering at least one landing area, on which the source device is to be mounted, of the target device with an adhesive layer, a step 220 for lifting-off the at least one source device from the second wafer by a conformable transfer element, a step 225 for positioning the at least one source device onto the at least one landing area of the target device, a step 230 for lifting-off the transfer stamp from the at least one source device.

a step of connecting 235 the at least one source device electrically to the target device;

The method would normally also include a step of packaging the at least one source device and the at least one target device so as to form the semiconductor chip 100.

Depending on the size and position of the magnetic elements 110 on the source wafer, and the size and the position of the electronic circuits 120 on the target wafer, the steps 220 to 230 for transferring the at least one, usually a plurality of source devices to the target wafer, may have to be repeated multiple times, as indicated by the dotted arrow.

Of course the manufacturing of both wafers in step 205 and 210 may be executed in parallel, or in reverse order.

In embodiments of the present invention the second wafer has a higher carrier mobility than the carrier mobility in the first wafer.

FIG. 3 illustrates different process steps in accordance with an embodiment of the present invention. For each of the process steps the intermediate products are shown. The intermediate products are illustrated by their vertical cross-section.

In embodiments of the present invention the source devices are smaller and therefore the density of the source devices on the second wafer can be made higher than the density of the target devices on the first wafer. In these embodiments the source devices are placed on the target devices in multiple steps. This is illustrated in FIG. 3 wherein the method steps in accordance with an embodiment of the present invention are repeated until all target devices are covered.

In an exemplary embodiment of the present invention the source devices 110 in the second wafer 310 may be Hall plates with a size of a few 10 micrometers. The target devices 120 (e.g. comprising the bonding pads) are made on the first wafer 130 and may have a size of a few 100 micrometers. Therefore the effective number of source devices is at least an order of magnitude higher than for the target devices on the first wafer. The effective number of source devices may be above 100 k, preferably above 1M pieces/wafer. Increasing the density of source devices on the second wafer decreases the wafer cost (e.g. GaAs cost) per source device.

In step 205 shown on the right of FIG. 3(a) the target devices 120 are manufactured on a first wafer 130. This might for example be done through a CMOS process. Such a target device may be an electronic circuit.

In a step 210 shown on the right of FIG. 3(a) the source devices are manufactured on a second wafer 310. This might for example be done through a III-V process (e.g. GaAs). According to embodiments of the present invention the carrier mobility of the source device is higher than the carrier mobility of the target device, measured at room temperature.

In step 215 (not shown) the area of the target device whereon the source device is to be mounted, i.e. the landing area, is covered with an adhesive layer. This step is not illustrated in FIG. 3.

In step 220 shown in FIG. 3(b) to (d), one or more source devices 110 are lifted off from the second wafer 310 by a conformable transfer element 320. In FIG. 3(b) the lowering of the stamp onto the second wafer 310 is illustrated. In FIG. 3(c) the adhesion of the source devices 110 to the transfer stamp 320 is illustrated. In FIG. 3(d) the lift-off of the source devices 110 is illustrated.

In the example illustrated in FIG. 3, the density of the source devices on the second wafer 310 is higher than the density of the target devices on the first wafer 130. Therefore only a selection of source devices is lifted, whereby the selection is such that each selected source device has a target device in a corresponding position. This is illustrated in FIG. 3(d).

In a next step 225, illustrated in FIGS. 3(e) and (f), the source devices 110 are positioned on the landing area of the target devices 120. Therefore they are first transferred to the first wafer 130. This is illustrated in FIG. 3(e). Next they are stamped on the target wafer, as illustrated in FIG. 3(f)

In a next step 230, illustrated in FIG. 3(g), the transfer stamp 320 is lifted off from the source devices, leaving the source devices 110 on the target devices 120. Steps 220, 225, 230 (and optionally also step 215) can be repeated until the desired number of source devices are positioned on the selected target devices. A possible result thereof is shown in FIG. 3(h) showing in the left column one remaining source device 110 and in the right column a source device positioned on each target device 120.

In embodiments of the present invention the method for manufacturing a semiconductor chip 100 for measuring a magnetic field comprises a step 235 for connecting the at least one source device electrically to the target device. In embodiments of the present invention a conductive distribution layer 150, for example in the form of RDL, may be applied to obtain an electrical connection between the at least one source device and the at least one target device.

In embodiments of the present invention a ferromagnetic layer is applied on top of the previously applied conductive distribution layer 150 (not shown). Thereby the conductive distribution layer serves as a base layer for applying the ferromagnetic layer.

In embodiments of the present invention the source devices are manufactured in step 205. The source devices are thereby manufactured with small pads for applying the distribution layer. The area of these pads is smaller than 50 μm, preferably smaller than 10 μm. It is an advantage of embodiments of the present invention that no big costly pads for bumps or wire bond are required on the source devices, because by doing so, the density of the devices on said wafer can be increased, and hence, more devices can be obtained from said wafer.

In embodiments of the present invention the method 200 comprises a bumping process wherein the conductive distribution layer serves as a redistribution layer for the bumping process.

FIG. 4 illustrates additional method steps and the corresponding intermediate products in accordance with embodiments of the present invention. In FIG. 4(a) a vertical cross-section is shown of a plurality of semiconductor chips wherein each of the semiconductor chips comprises a source device 110 mounted on a target device 120 wherein the target devices are embedded in a first wafer 130.

In embodiments of the present invention the source device 110 is a magnetic sensing element and the target device 120 is an electronic circuit. In a method step 235 in accordance with embodiments of the present invention the source and the target device are electrically connected together. The result thereof is illustrated in FIG. 4(b) wherein a distribution layer 150 is shown which electrically connects the source device 110 to the target device. In a next step, of which the result is illustrated in FIG. 4(c), semiconductor chips 100 singulation is applied by means of a dicing saw.

Additional steps, in accordance with embodiments of the present invention, for manufacturing a semiconductor chip for measuring a magnetic field, are illustrated in FIG. 5. FIG. 5(a) shows a vertical cross-section of a semiconductor chip 100 in accordance with an embodiment of the present invention after assembly of the semiconductor chip onto a leadframe 140. FIG. 5(b) shows the cross-section after adding a bonding connection from the distribution layer 150 to the leadframe 140. In embodiments of the present invention the semiconductor chip 100 is assembled into a plastic package. FIG. 5(c) shows the cross-section of a semiconductor chip 100 encapsulated in a plastic package 510 after plastic packaging of the semiconductor chip 100. By combining the IMC base layer process, the source element to CMOS electrical connection (typically done via the redistribution layer) and the redistribution layer for the bumping or Cu pillars, significant cost savings can be achieved.

Compound magnetic field sensors according to embodiments of the present may be used for example as position sensors, rotary speed sensors, current sensors or compass sensors.

The invention claimed is:

1. A semiconductor chip for measuring a magnetic field, the semiconductor chip comprising a magnetic sensing element, an electronic circuit, and a conductive distribution layer, wherein:
   the magnetic sensing element is mounted on the electronic circuit,
   the magnetic sensing element is electrically connected with the electronic circuit,
   and wherein the electronic circuit comprises a first material and the magnetic sensing element comprises a second material different from the first material and wherein the second material has a higher carrier mobility than the first material,
   wherein an adhesive layer is present between the magnetic sensing element and the electronic circuit, and
   wherein the magnetic sensing element is provided with a pad smaller than 10 μm, and wherein the conductive distribution layer makes an electrical connection between the magnetic sensing element and the electronic circuit.

2. A semiconductor chip according to claim 1, whereby the second material is chosen such that the carrier mobility at room temperature is higher in the second material than in the first material.

3. A semiconductor chip according to claim 1, wherein the magnetic sensing element comprises at least one Hall sensor.

4. A semiconductor chip according to claim 3, wherein the magnetic sensing element has a thickness of less than 5 μm.

5. A semiconductor chip according to claim 3, wherein the magnetic sensing element is a quantum well Hall sensor.

6. A semiconductor chip according to claim 1, wherein the second material comprises gallium-arsenide.

7. A semiconductor chip according to claim 1, wherein the first material is made of silicon.

8. A semiconductor chip according to claim 1, further comprising a ferromagnetic layer on top of the conductive distribution layer.

* * * * *